US011870005B2

(12) United States Patent
Efros et al.

(10) Patent No.: US 11,870,005 B2
(45) Date of Patent: Jan. 9, 2024

(54) QW-QWD LED WITH SUPPRESSED AUGER RECOMBINATION

(71) Applicant: The Government of the United States of America, as represented by the Secretary of the Navy, Arlington, VA (US)

(72) Inventors: Alexander L. Efros, Annandale, VA (US); Michael Shur, Troy, NY (US)

(73) Assignee: The Government of the United States of America, as represented by the Secretary of the Navy, Arlington, VA (US)

( * ) Notice: Subject to any disclaimer, the term of this patent is extended or adjusted under 35 U.S.C. 154(b) by 863 days.

(21) Appl. No.: 16/916,690

(22) Filed: Jun. 30, 2020

(65) Prior Publication Data
US 2021/0005779 A1 Jan. 7, 2021

Related U.S. Application Data

(60) Provisional application No. 63/030,661, filed on May 27, 2020, provisional application No. 62/869,045, filed on Jul. 1, 2019.

(51) Int. Cl.
| | | |
|---|---|---|
| *H01L 33/00* | (2010.01) | |
| *H01L 33/06* | (2010.01) | |
| *B82Y 20/00* | (2011.01) | |
| *H01L 33/24* | (2010.01) | |

(52) U.S. Cl.
CPC .............. *H01L 33/06* (2013.01); *B82Y 20/00* (2013.01); *H01L 33/24* (2013.01)

(58) Field of Classification Search
CPC ......... H01L 33/06; H01L 33/08; H01L 33/24; B82Y 20/00
See application file for complete search history.

(56) References Cited

U.S. PATENT DOCUMENTS

| 7,087,923 | B2 * | 8/2006 | Ward ...................... H01S 5/341 |
| | | | 257/14 |
| 2008/0218068 | A1 * | 9/2008 | Cok ..................... H05B 33/145 |
| | | | 977/939 |
| 2013/0009152 | A1 * | 1/2013 | Shreter .................. H01L 33/16 |
| | | | 257/77 |
| 2013/0240829 | A1 * | 9/2013 | Kuramachi ....... H01L 21/02458 |
| | | | 359/326 |
| 2014/0007921 | A1 * | 1/2014 | Kuramachi ......... H01L 31/0384 |
| | | | 359/326 |
| 2017/0200841 | A1 * | 7/2017 | Yoshikawa ..... H01L 31/035236 |
| 2018/0108804 | A1 * | 4/2018 | Ellis ...................... H01S 5/3416 |
| 2020/0017765 | A1 * | 1/2020 | Kim ...................... H10K 59/38 |
| 2020/0165517 | A1 * | 5/2020 | Lee ................. H01L 31/035236 |
| 2020/0403126 | A1 * | 12/2020 | Owen ................... C09K 11/883 |

* cited by examiner

*Primary Examiner* — Savitri Mulpuri
(74) *Attorney, Agent, or Firm* — US Naval Research Laboratory; Rebecca L. Forman

(57) ABSTRACT

An optoelectronic device comprising at least one quantum well (QW) and at least one quantum dot (QD) incorporated in the quantum well with the band gap of the quantum well being larger than the band gap of the quantum dot. The QDs and QD arrays are embedded in various QW, thus providing higher yields in optoelectronic devices, such as light emitting diodes, lasers, and photodetectors. This is achieved by a nearly complete suppression of the nonradiative Auger recombination and enhancement of the light extraction efficiency.

9 Claims, 8 Drawing Sheets

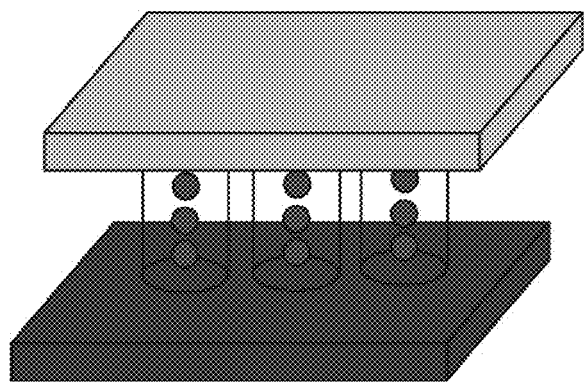 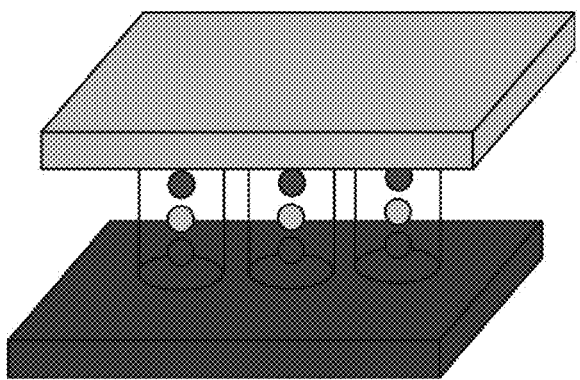
FIG. 14A                    FIG. 14B
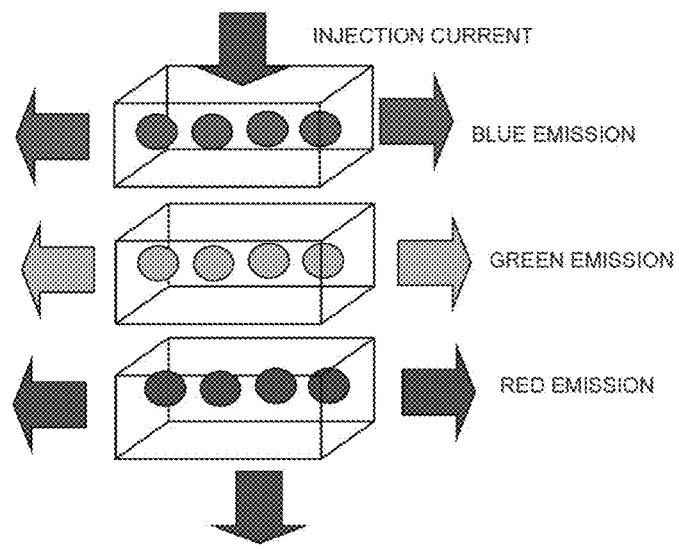
FIG. 15

QW-QWD LED WITH SUPPRESSED AUGER RECOMBINATION

RELATED APPLICATIONS

This application claims the benefit of U.S. provisional applications No. 62/869,045, filed Jul. 1, 2019 and No. 63/030,661 filed May 27, 2020, both of which are incorporated herein by reference in their entireties.

TECHNICAL FIELD

The disclosure relates generally to solid state light devices operating in infrared, visible, and ultraviolet ranges.

BACKGROUND

This invention relates to quantum dots (QDs) that are nanocrystals that have the number of the surface atoms smaller that a certain fraction, $\alpha$, of the all atoms in the nanocrystal. To be specific, QDs typically have $\alpha < \frac{1}{3}$, while Surface Quantum Dots (SQDs) typically have $\alpha > \frac{1}{3}$.

The QDs and, to a lesser extent, SQDs, are used for many applications, especially in photonic materials and devices, such as the stained glass used Gold Nanocrystals Color in the Lycurgus Cup (4th century AD). The brilliant colors of the Lycurgus Cup are controlled by the diameter of the quantum dots, since the absorption and emission of light depend on the QD dimension. The reason is that the quantum confinement promotes the ground electron and hole states above that in the bulk material of the same composition. When electrons and holes are excited in QDs (or SQDs) they recombine and might emit light, with the frequency of the emitted light increasing with decreasing the quantum dot dimension. FIG. 1 (prior art) shows how the emission spectrum of CdSe/CdS QDs changes with QD size (Viet Ha Chu et al, "Synthesis and optical properties of water soluble CdSe/CdS quantum dots for biological applications," Adv. Nat. Sci.: Nanosci. Nanotechnol., 3, 025017 (2012)).

This ability of producing light of different colors by adjusting the QD size and composition has been used in many QD light-emitting diodes (LEDs) and light detecting devices that have been developed (see, e.g., Ryzhii et al., "Quantum well and quantum dot infrared photodetectors: physics of operation and modeling," Proceedings of SPIE—17th International Conference on Photoelectronics and Night Vision Devices, Volume 5126 (Sep. 30, 2003); Shen et al., "Visible quantum dot light-emitting diodes with simultaneous high brightness and efficiency," Nat. Photon., 13, 192-197 (2019); Jo et al., "High efficiency red electroluminescent device based on multi shelled InP quantum dots," Opt. Lett., 41, 3984-3987 (2016); Wang et al., "Cadmium-free InP/ZnSeS/ZnS heterostructure-based quantum dot light emitting diodes with a ZnMgO electron transport layer and a brightness of over 10000 cd m$^{-2}$," Small, 1603962 (2017); Lim et al., "Highly efficient cadmium-free quantum dot light-emitting diodes enabled by the direct formation of excitons within InP@ZnSeS quantum dots," ACS Nano, 7, 9019-9026 (2013); and Guo et al., "Origins of inhomogeneous light emission from GaN-based flip-chip green micro-LEDs," IEEE Electron Dev. Lett., 40, 7, 1132 (2019)).

The present invention deals with photonic and optoelectronic materials and devices using such quantum dots. In these devices, the efficiency, output power, sensitivity, and dynamic range all depend on the quantum yield that is typically described by the so-called ABC equation—Equation (1) (see, e.g., ukauskas et al., "Introduction to Solid State Lighting," John Wiley and Sons (2002) ISBN: 0471215740).

$$Q = \frac{Bn^2}{An + Bn^2 + Cn^3} \quad (1)$$

Here n is the density of the electron-hole pairs, the term in $Bn^2$ describes the radiative emission rate, the term $An$ describes non-radiative recombination rate, and the term $Cn^3$ describes the so-called Auger recombination. As seen from Equation (1), the higher the Auger recombination rate $Cn^3$, the smaller the quantum yield Q. Since the Auger recombination rate is proportional to the third power of $n^3$ it is especially important at large injection levels and limits LED output power and light sensor dynamic range.

In certain materials (primarily wide band gap materials), radiative recombination is determined by the exciton recombination. However, the same argument about the deleterious effect of the Auger recombination still applies.

In the Auger recombination process, the energy released during the electron-hole recombination act (which is equal or (typically) larger than the band gap energy) promotes another electron to a higher energy state, see FIG. 2 (prior art).

As seen from Equation (1), it is very important to suppress the Auger recombination. Efros et al. taught using the composition profile of a QD to suppress the Auger recombination by adjusting the shape of the potential profile and making it smoother (Efros et al., "Auger rate suppression in confined structures," U.S. Pat. No. 8,394,651 (Mar. 12, 2013)) (see FIGS. 3A-3C (PRIOR ART)). As shown in FIG. 1, the prior art used smooth spherical variation in the potential to limit the Auger recombination. This required a radial variation of the QD composition, which might be difficult to achieve.

The reason why the smooth potential helps suppress the Auger recombination could be understood from the uncertainly principle. The Auger electron shown in FIG. 2 has to have a high energy (higher than the energy gap) and, therefore, a large momentum. Hence, the electron wave function overlap with the interaction potential is large for an abrupt potential (that has high spatial Fourier components) but averages out for a smoother potential. Efros et al. taught two ways to make the quantum dot potential smoother schematically shown in FIGS. 3B and 3C (PRIOR ART). Such profiles could be achieved in QDs having light emissive core/shell structure (Cok, United States Patent Application Publication 2008/0218068, (Sep. 11, 2008)).

In contrast to the radiative emission from a QD involving a single electron hole (e-h) pair, the nonradiative Auger recombination involves two electron hole pairs. In such QDs the photo excited e-h pair undergo a process known as nonradiative Auger recombination. During this process, the recombination energy of an e-h pair is transferred to an extra carrier (an electron or a hole). The time of such Auger processes in standard QDs is much shorter (~10-100 ps) than radiative recombination time and the Auger processes completely quench PL in QDs. The rate of Auger process is determined by the "momentum conservation." After the Auger process, the involved electron (or the hole) has a very large momentum $k_f$ and the Auger rate is determined by a magnitude of the Fourier component of the wave function of the ground state at the final momentum $k_f$. Smooth confined potential QD profile reduces the magnitude of such Fourier components and, therefore, suppresses the Auger recombination.

Efros et al. and Lim et al. demonstrated theoretically and experimentally that graded potential QDs and multi-shell QDs, respectively, suppress the Auger processes by reducing the e-h wave function overlap (Efros et al., "Auger rate suppression in confined structures," U.S. Pat. No. 8,394,651 (Mar. 12, 2013) and Lim et al., Nature Mater., 17, 42-49 (2018)). The present invention achieves a much stronger suppression of Auger processes and the proposed structures are much easier to scale for displays and photodetector arrays.

SUMMARY OF THE INVENTION

The present disclosure relates to a novel quantum dot (QD)/quantum well (QW) heterostructure, where nonradiative Auger recombination is suppressed to achieve a much more efficient optically active structure. The suppression of nonradiative Auger recombination is achieved by placing a QD into a quantum well with dimensions optimized to smooth the asymmetric potential profile as shown in FIG. 4 (notice the change from radial dependence in FIG. 3 (prior art) to distance dependence because of the different dependence on distance in the perpendicular direction. Another embodiment of this invention teaches arrays of such QD as shown in FIGS. 5B and 5C. Still another embodiment uses graded potential profiles of the quantum well for further optimization and a more complete suppression of the Auger recombination. Such arrays could be further combined into a superlattice with a periodic array of narrow gap QDs embedded in wider gap QWs and using the spatial dependence of the effective mass and two-step confinement potential. These structures are heterodimensional structures comprising three-dimensional (typically pyramidal or spherical) QDs incorporated into two-dimensional QWs. The heterodimensional geometry enables a variety of the photonic and optoelectronic materials and devices using quantum dots with suppressed Auger recombination. Auger recombination is suppressed using the space dependence of the effective mass and step-like confinement potential enabled by heterocomposition. One purpose of this invention is the creation of high brightness efficient displays and sensitive photodetectors.

One embodiment of the present invention is an optoelectronic device (light emitting diode, a laser, a photodetector, or any combination thereof) comprising at least one quantum well and at least one quantum dot incorporated in the quantum well with the band gap of the quantum well being larger than the band gap of the quantum dot. This embodiment uses the QDs and QD arrays embedded in various QW, thus providing higher yields in optoelectronic devices, such as light emitting diodes, lasers, photodetectors or their combinations. This is achieved by a nearly complete suppression of the nonradiative Auger recombination and enhancement of the light extraction efficiency.

The present invention provides new features and advantages. The quantum dots incorporated into the quantum wires can emit different wavelengths. The position of the quantum wells between the electron and hole emitter can be adjusted to equalize fluxes. The proposed structures can be placed into a potential well with the band discontinuity larger than the optical phonon energy.

Additional details and advantages of the disclosure will be set forth in part in the description, which follows, and/or may be learned by practice of the disclosure. The details and advantages of the disclosure may be realized and attained by means of the elements and combinations particularly pointed out in the appended claims. It is to be understood that both the foregoing general description and the following detailed description are exemplary and explanatory only and are not restrictive of the disclosure, as claimed.

BRIEF DESCRIPTION OF THE DRAWINGS

FIG. 3A is for a uniform QD. FIG. 3B is for a QD with a smooth potential for suppressing the Auger recombination as taught by Efros et al. FIG. 3C is for a QD with core/shell structure for suppressing the Auger recombination as taught by Efros et al.

FIG. 5A is for a single QD. FIG. 5B is for a QD one-dimensional array. FIG. 5C is for a QD two-dimensional array.

FIG. 14A shows vertical LEDs using multiple QWs in a quantum wire. FIG. 14B shows vertical LEDs using QDs in a quantum wire emitting red, green, and blue light.

FIG. 15 shows lateral LEDs using QDs in a quantum wire emitting red, green, and blue light.

DETAILED DESCRIPTION

Various embodiments of the disclosure provide (a) a new way of optimizing a potential profile to suppress the Auger recombination using the heterodimensional geometry and (b) the photonic and optoelectronic materials and devices using such optimized quantum dots. The present invention also identifies a new mechanism of suppressing the Auger recombination related to the dependence of the electron effective mass in QD on distance.

Figure 4:
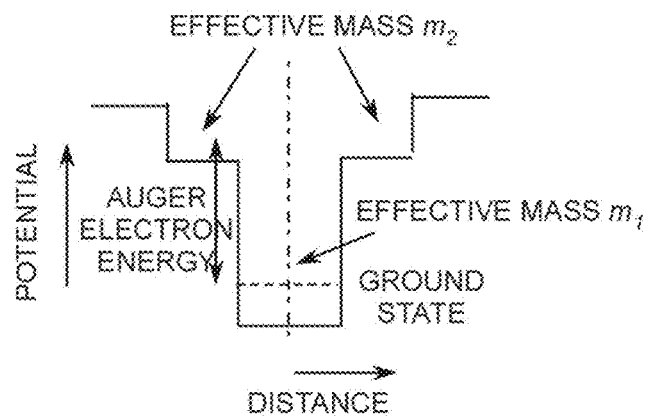
FIG. 4 shows potential versus distance for a QD with space-dependent effective mass.

FIG. 4 illustrates the basic idea, which is to use the structure, in which the QD or SQD is enveloped by the material, such that (a) it creates a barrier with the energy close to that of the Auger electron in the QD and (b) has a higher effective mass.

The physics involved is in using the discontinuity of the effective mass at the QD/QW to create an addition potential acting on e-h. This potential removes large momenta from Fourier transform of the wave function of the ground state consequently suppressing the Auger recombination due to the absence of the overlap of the Fourier functions in the initial and final states. The space dependence of effective mass leads to the appearance of momentum-dependent additional potential, U(k) (Milanovich et al., Physica B, 114, 375 (1982); Gribnikov, et al., J. Appl. Phys., 77, 1337 (1995); and Dyakonov et al., J. Appl. Phys., 84, 3726 (1998)

$$U(k) = k^2 \left( \frac{1}{2m_1} - \frac{1}{2m_2} \right) \quad (2)$$

where $m_1$ and $m_2$ are the effective masses in the quantum well and barrier regions, respectively (FIG. 4), and q is the electron momentum. As predicted by the Kane model, the electron effective mass in the narrow band material is usually smaller than in the wide-band material ($m_1 < m_2$). Hence, the additional potential U(q) leads to the disappearance of quantum well for the electrons (or holes) with the momentum as shown in Equation (3).

$$q^2 > q_{cr}^2 = \frac{U_0}{(1/2m_1 - 1/2m_2)} \quad (3)$$

Here $U_0$ is the depth of the potential well created by the conduction (or valence) band discontinuities. As predicted in Equation (3), the electrons (or holes) with such q's are localized in the barrier region of the heterostructure QD.

This mechanism of the Auger recombination suppression will work even better in the heterodimensional systems shown in FIGS. 5A-5C, 6, and 7 because of a higher density of states in the quantum well compared to the QD. The quantum well is defined as potential well with the width smaller than two mean electron free paths for the electron collisions with impurities and lattice vibrations.

Figure 8A:
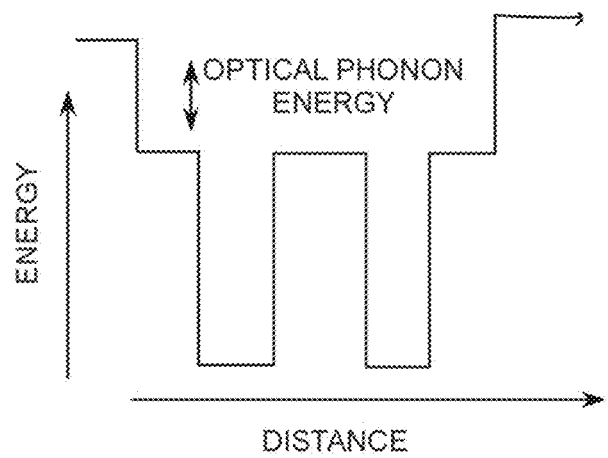
FIG. 8A is a band diagram of the potential well deeper than the energy of an optical phonon in the potential well material and incorporating QDs.
Figure 8B:
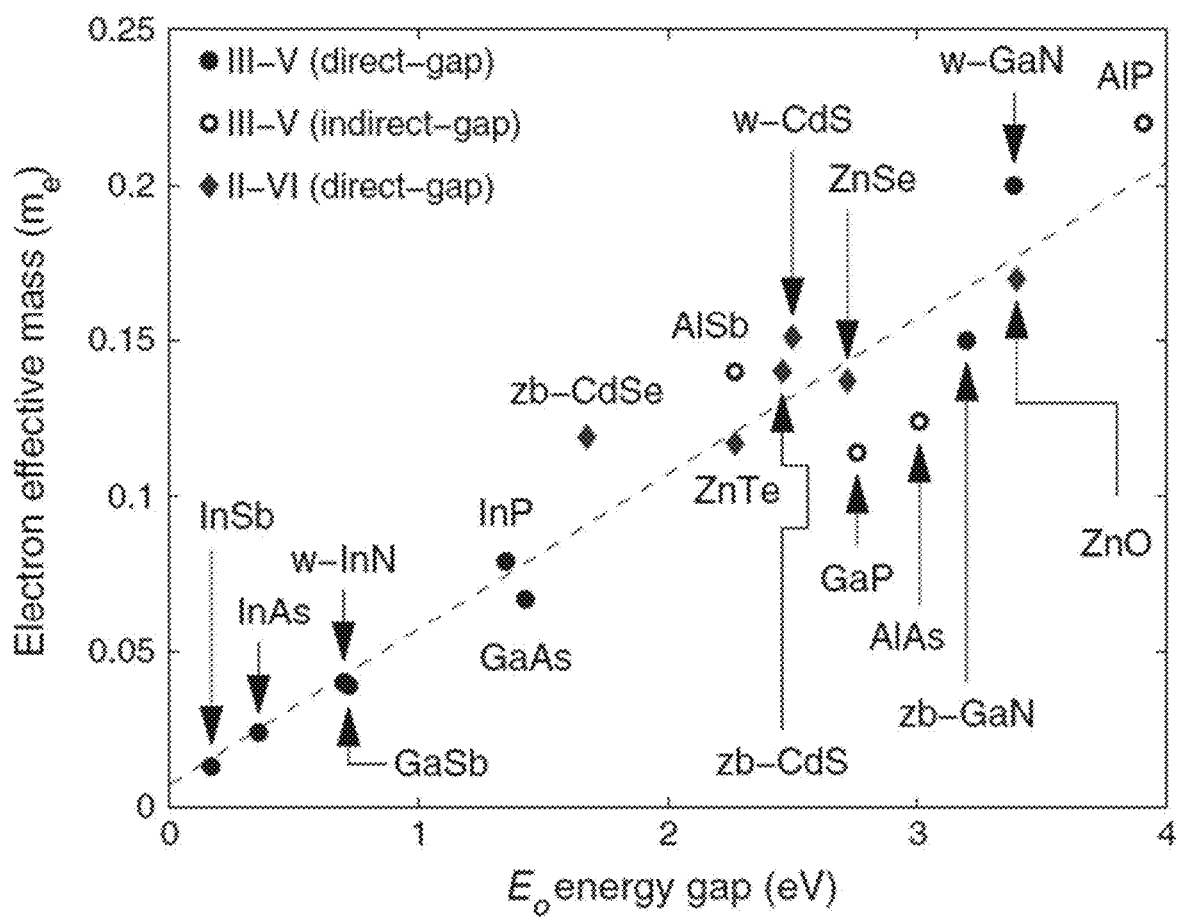
FIG. 8B (PRIOR ART) shows the dependence of the effective mass on band gap.

Therefore, in contrast to prior art, the Auger recombination in the proposed structures is suppressed by two physical mechanisms. The first mechanism is similar to that in prior art, even though more effective because of the heterodimensional geometry having even less of high k potential Fourier components. The second mechanism is the electrons with higher energies (such as the Auger electrons) being mostly confined in the quantum well that has a higher effective mass, see FIG. 8B (PRIOR ART) from Hadi et al., J. Mater. Sci.: Mater. Electron. 25, 4675 (2014).

Figure 5A:
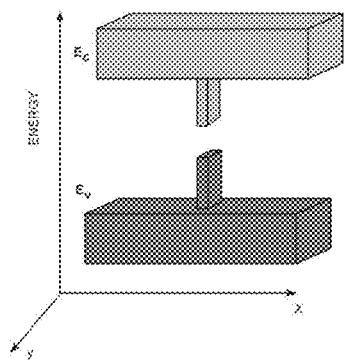
FIGS. 5A-5C show potential versus distance for a quantum dot in wider band gap quantum well (QW) for suppressing the Auger recombination.
Figure 5B:
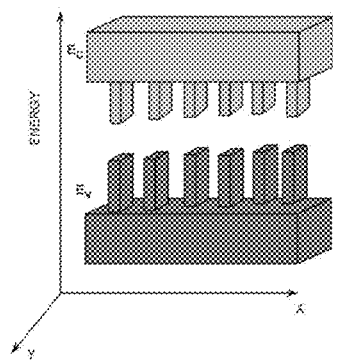
Figure 6:
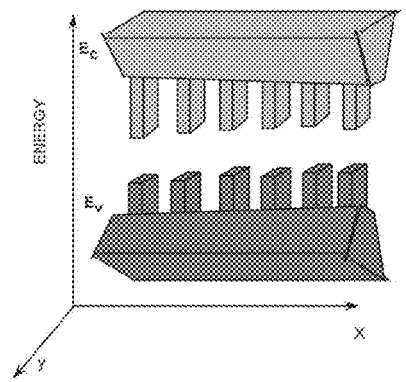
FIG. 6 is a band diagram of QDs in QW with profiled band structure.

FIG. 5A shows the potential versus distance for a single quantum dot in wider band gap QW for suppressing the Auger recombination. FIGS. 5B and C show similar band diagrams for a QD one-dimensional array and a QD two-dimensional array, respectively. FIG. 6 shows the band diagrams of QDs in a QW with profiled band structure. This profiling could be achieved by a compositional grading and could be used to optimize the suppression of the Auger recombination.

Figure 7:
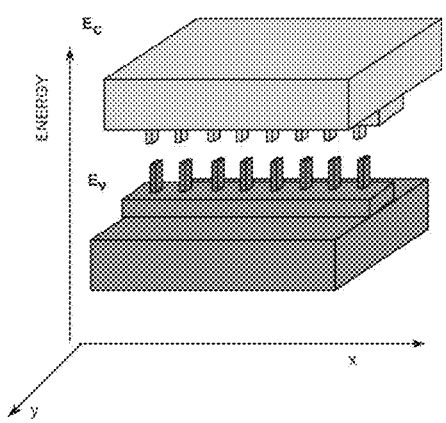
FIG. 7 is a band diagram of QDs in a double profile QW or in a QW placed in a wider band gap potential well.
Figure 9:
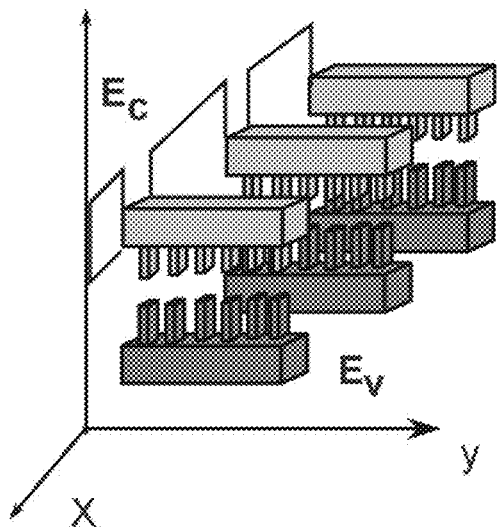
FIG. 9 is a band structure of a superlattice QD structure.

FIG. 7 shows the band diagram of QDs in double profile QW or in QW placed in a wider band gap potential well. Such structure could serve two purposes: (a) it could be used for the optimization of the Auger recombination suppression and (b) for capturing electron hole pairs containing then in the potential well and not allowing to cross the structure rather than recombining. To this end, the depth of the potential well should be deeper than the energy of an optical phonon in the potential well material (see FIG. 8A). The QD structures in QWs could form a superlattice as schematically shown in FIG. 9.

Figure 5C:
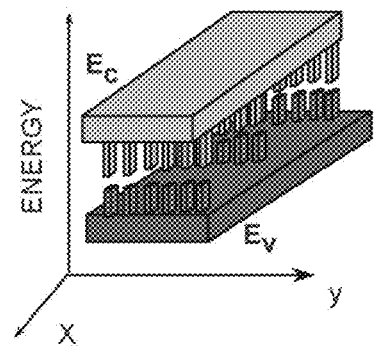
Figure 10A:
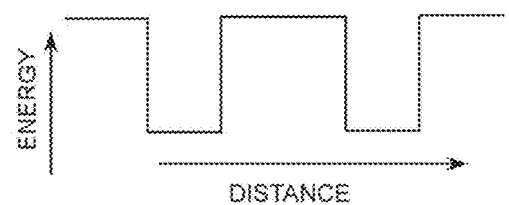
FIG. 10A is a band diagram in the QW plane for quantum wells separated by the distance larger than a characteristic tunneling distance.
Figure 10B:
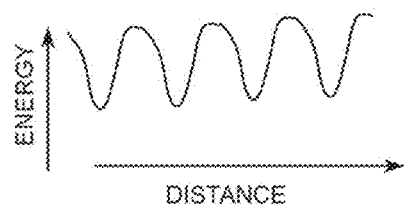
FIG. 10B is a band diagram in the QW plane for quantum wells separated by the distance smaller than a characteristic tunneling

As seen in FIGS. 5A-5C, in contrast to the compositionally graded QD or SQD, the band structure is anisotropic, with two different directions, allowing for the tuning polarization characteristics of such composite QW. As shown in FIG. 5B, another design parameter is the distance between the QDs that allows for adjusting the barrier height by changing the distance between QDs, as shown in FIGS. 10A and 10B. FIG. 10A shows the band diagram in the QW plane for quantum wells separated by a distance larger than a least characteristic tunneling distances as represented in Equation (4).

$$\lambda_T = 2\pi/q_2 = 2\pi\hbar/(2U_o m_2)^{0.5} \quad (4)$$

In contrast, FIG. 10B shows the band structures for QDs separated by a smaller distance than $\lambda_T$.

Figure 1:
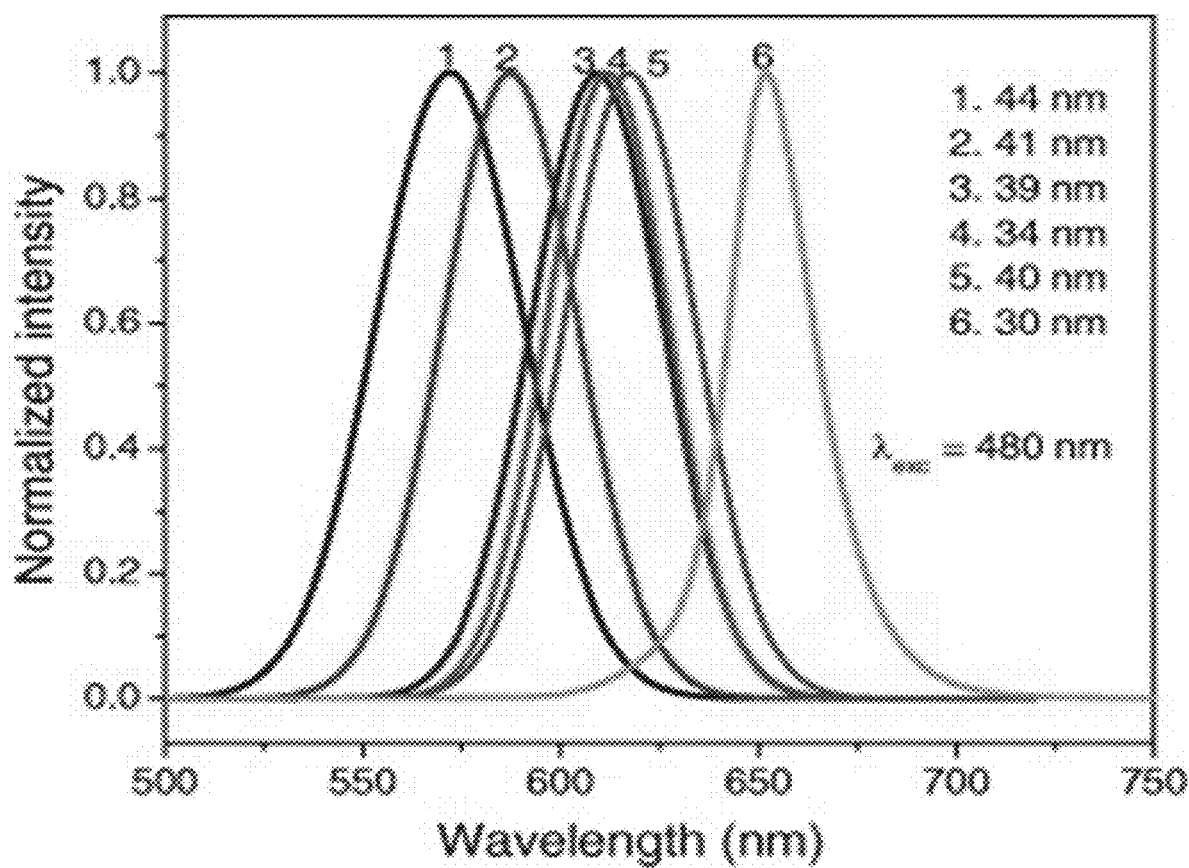
FIG. 1 (PRIOR ART) shows normalized emission spectrum of CdSe QDs.
Figure 2:
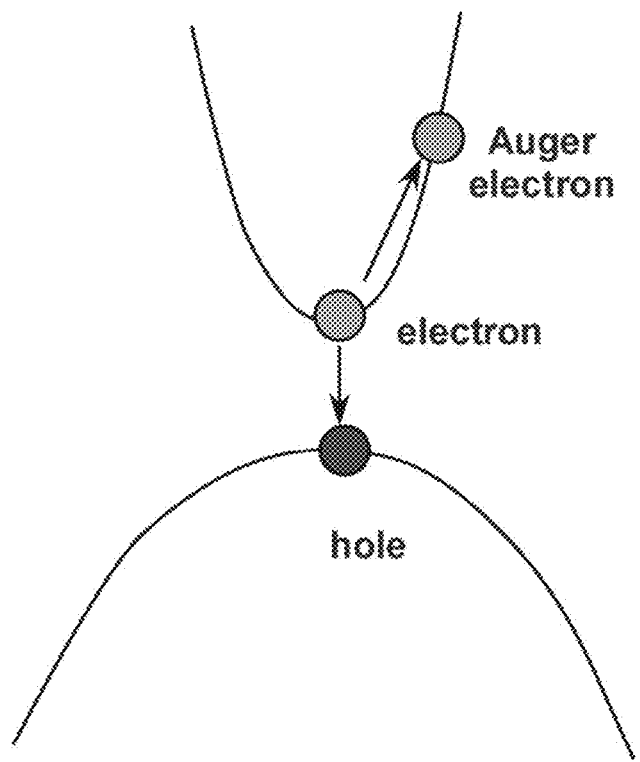
FIG. 2 (PRIOR ART) is a schematic of the Auger recombination.
Figure 3A:
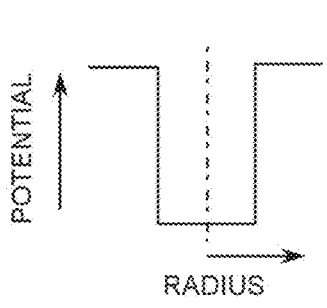
FIGS. 3A-3C (PRIOR ART) show potential versus radius for a quantum dot.
Figure 3B:
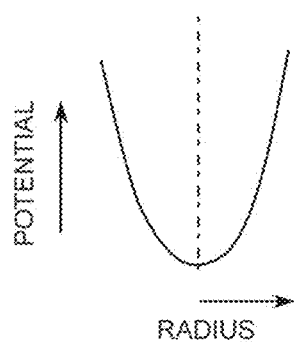
Figure 3C:
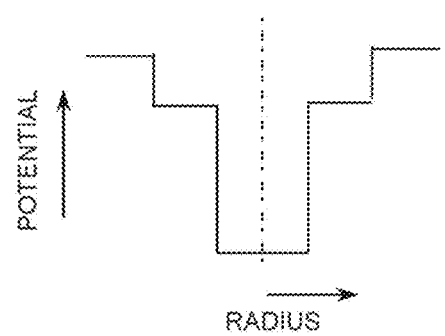
Figure 11A:
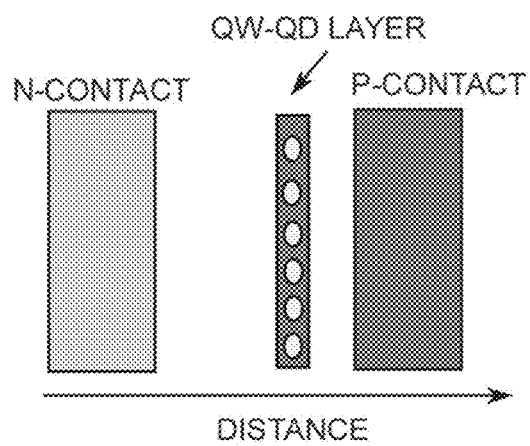
FIG. 11A is a QD-QW structure placed between the electron and hole injection contacts to optimize recombination rate.
Figure 11B:
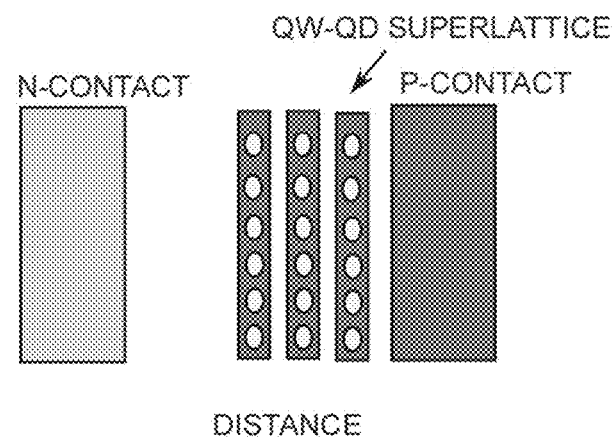
FIG. 11B is a superlattice placed between the electron and hole injection contacts to optimize recombination rate.

The quantum structures described above could be used in light emitting diodes, where the placement of these structures with respect to the electron and hole injection contacts as shown in FIGS. 1A and 11B.

Figure 12A:
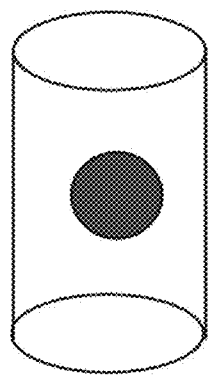
FIG. 12A shows a single QD incorporated into a quantum wire.
Figure 12B:
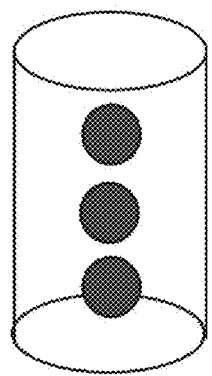
FIG. 12B shows multiple QWs in a quantum wire.
Figure 12C:
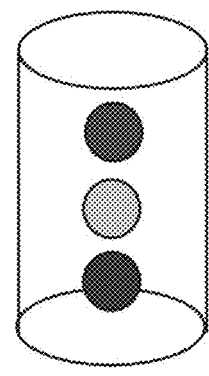
FIG. 12C shows QDs in a quantum wire emitting red, green, and blue light for white light.
Figure 13A:
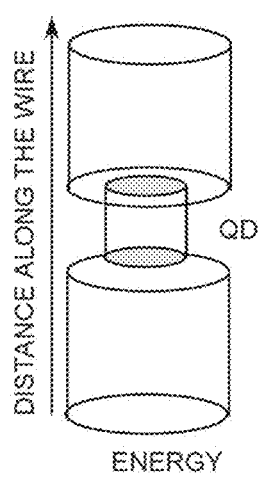
FIGS. 13A-13C show band diagrams corresponding to the QD-QW structures shown in FIGS. 12A-12C, respectively.
Figure 13B:
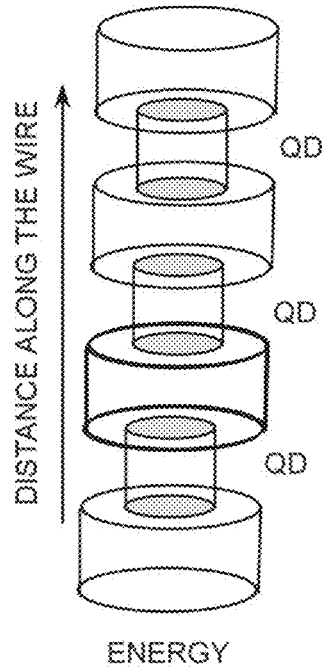
Figure 13C:
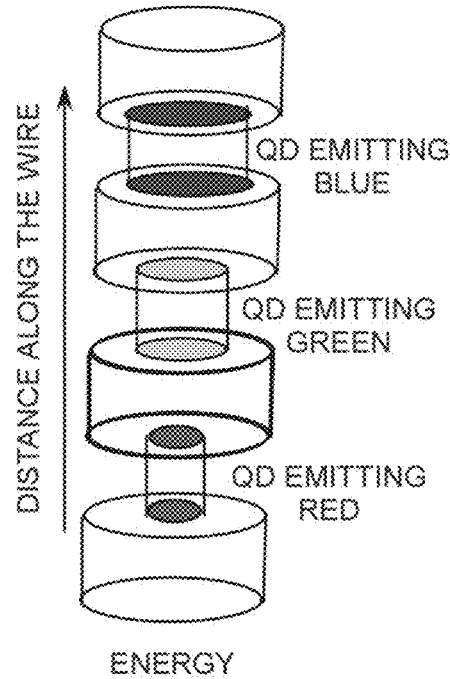

Another embodiment is placing the quantum dots within a quantum wire as shown in FIGS. 12A-12C. FIG. 12A shows a single QD incorporated into a quantum wire. FIG. 12B shows the placement of multiple QDs. FIG. 13C shows the QDs emitting red, green, and blue light, respectively. Such an emitter might serve as white light. More QDs with a larger variety of the emission wavelengths could be added for realizing different color gamut and optimizing the emission spectrum using statistical measures of color quality (ukauskas et al., "Statistical Approach to Color Quality of Solid-State Lamps," IEEE Journal of Selected Topics in Quantum Electronics, Vol. 15, Issue 4, 1189-1198 (2009)). FIG. 13 shows the corresponding band diagrams.

FIGS. 14A, 14B and 15 show the vertical and lateral LEDs using the QD-QW structures described above. FIG. 14A shows vertical LEDs using multiple QWs in a quantum wire. FIG. 14B shows vertical LEDs using QDs in a quantum wire emitting red, green, and blue light. FIG. 15 shows lateral LEDs using QDs in a quantum wire emitting red, green, and blue light.

The QD arrays of different sizes embedded in QWs can enable white LED and lasers or radiation emitters operating in different spectral ranges (from terahertz to ultraviolet). QDs might be also embedded in nanowires for other types of multifunctional and/or multi frequencies LEDs and radiation emitter or photodetectors. As an example, direct optical gap hexagonal Si and Ge was grown only in nanowire form. The proposed nanowire emitters could use hexagonal Si and Ge to enable silicon photonics.

At numerous places throughout this specification, reference has been made to a number of U.S. patents and other documents. All such cited documents are expressly incorporated in full into this disclosure as if fully set forth herein.

Other embodiments of the present disclosure will be apparent to those skilled in the art from consideration of the specification and practice of the embodiments disclosed herein. As used throughout the specification and claims, "a" and/or "an" may refer to one or more than one. Unless otherwise indicated, all numbers expressing quantities of ingredients, properties such as molecular weight, percent, ratio, reaction conditions, and so forth used in the specification and claims are to be understood as being modified in all instances by the term "about," whether or not the term "about" is present. Accordingly, unless indicated to the contrary, the numerical parameters set forth in the specification and claims are approximations that may vary depending upon the desired properties sought to be obtained by the present disclosure. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. It is intended that the specification and examples be considered as exemplary only, with a true scope and spirit of the disclosure being indicated by the following claims.

The foregoing embodiments are susceptible to considerable variation in practice. Accordingly, the embodiments are not intended to be limited to the specific exemplifications set forth herein above. Rather, the foregoing embodiments are within the spirit and scope of the appended claims, including the equivalents thereof available as a matter of law.

The patentees do not intend to dedicate any disclosed embodiments to the public, and to the extent any disclosed modifications or alterations may not literally fall within the scope of the claims, they are considered to be part hereof under the doctrine of equivalents.

It is to be understood that each amount/value or range of amounts/values for each component, compound, substituent or parameter disclosed herein is to be interpreted as also being disclosed in combination with each amount/value or range of amounts/values disclosed for any other component(s), compounds(s), substituent(s) or parameter(s) disclosed herein and that any combination of amounts/values or ranges of amounts/values for two or more component(s), compounds(s), substituent(s) or parameters disclosed herein are thus also disclosed in combination with each other for the purposes of this description. It is further understood that each range disclosed herein is to be interpreted as a disclosure of each specific value within the disclosed range that has the same number of significant digits. Thus, a range of from 1-4 is to be interpreted as an express disclosure of the values 1, 2, 3 and 4.

It is further understood that each lower limit of each range disclosed herein is to be interpreted as disclosed in combination with each upper limit of each range and each specific value within each range disclosed herein for the same component, compounds, substituent or parameter. Thus, this disclosure to be interpreted as a disclosure of all ranges derived by combining each lower limit of each range with each upper limit of each range or with each specific value within each range, or by combining each upper limit of each range with each specific value within each range.

Furthermore, specific amounts/values of a component, compound, substituent or parameter disclosed in the description or an example is to be interpreted as a disclosure of either a lower or an upper limit of a range and thus can be combined with any other lower or upper limit of a range or specific amount/value for the same component, compound, substituent or parameter disclosed elsewhere in the application to form a range for that component, compound, substituent or parameter.

What is claimed is:

1. An optoelectronic device, comprising:
   at least one quantum well, wherein the at least one quantum well has a quantum well band gap; and
   at least one quantum dot incorporated in the quantum well, wherein the at least one quantum dot has a quantum dot band gap;
   wherein the quantum well band gap is larger than the quantum dot band gap, wherein the at least one quantum dot comprises periodic quantum dot arrays in that at least one quantum well, wherein the periodic quantum dot arrays have an effective barrier height, a characteristic tunneling length, and a distance between quantum dots, and wherein the effective barrier height is adjusted by adjusting the distance between quantum dots and by having a distance between quantum dots larger than the characteristic tunneling length.

2. The optoelectronic device of claim 1, wherein the at least one quantum dot has a quantum dot diameter, wherein the at least one quantum well has a quantum well width, and wherein the quantum dot diameter is at least half a nanometer smaller than the quantum well width.

3. The optoelectronic device of claim 1, wherein the at least one quantum well has a quantum well effective mass, wherein the at least one quantum dot has a quantum dot effective mass, and wherein the quantum well effective mass is larger than the quantum dot effective mass.

4. The optoelectronic device of claim 1, wherein the at least one quantum well has a quantum well composition, and wherein the quantum well composition varies in a direction perpendicular to the at least one quantum well.

5. The optoelectronic device of claim 1, wherein the at least one quantum dot forms a superlattice within the at least one quantum well.

6. The optoelectronic device of claim 1, wherein a conduction band discontinuity between the at least one quantum well and the at least one quantum dot is larger than an optical phonon energy.

7. The optoelectronic device of claim 1, wherein a valence band discontinuity between the at least one quantum well and the at least one quantum dot is larger than an optical phonon energy.

8. A device, comprising a vertically emitting LED comprising the optoelectronic device of claim 1.

9. A device, comprising a laterally emitting LED comprising the optoelectronic device of claim 1.

* * * * *